(12) United States Patent
North et al.

(10) Patent No.: US 10,426,063 B2
(45) Date of Patent: Sep. 24, 2019

(54) SYSTEM AND METHOD FOR COOLING AN INFORMATION HANDLING SYSTEM

(71) Applicant: DELL PRODUCTS, L.P., Round Rock, TX (US)

(72) Inventors: Travis C. North, Cedar Park, TX (US); Austin Michael Shelnutt, Leander, TX (US); Chris Helberg, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 10 days.

(21) Appl. No.: 14/612,426

(22) Filed: Feb. 3, 2015

(65) Prior Publication Data

US 2016/0227675 A1 Aug. 4, 2016

(51) Int. Cl.
*H05K 7/20* (2006.01)
*G06F 1/20* (2006.01)

(52) U.S. Cl.
CPC .......... *H05K 7/20836* (2013.01); *G06F 1/20* (2013.01); *H05K 7/20181* (2013.01)

(58) Field of Classification Search
CPC .................. H05K 7/20836; H05K 7/20718
USPC ........................................................ 700/300
See application file for complete search history.

(56) References Cited

U.S. PATENT DOCUMENTS

| 2005/0125102 | A1* | 6/2005 | Nichols | F24F 11/0086 700/276 |
| 2006/0152891 | A1* | 7/2006 | Jreij | H05K 7/20209 361/676 |
| 2007/0125107 | A1* | 6/2007 | Beam | 62/186 |
| 2010/0134972 | A1 | 6/2010 | Moss | |
| 2010/0170277 | A1 | 7/2010 | Schmitt | |
| 2011/0132581 | A1 | 6/2011 | Moss | |
| 2012/0164930 | A1* | 6/2012 | Murayama | H05K 7/20745 454/184 |
| 2012/0180979 | A1 | 7/2012 | Harrington | |
| 2012/0303164 | A1* | 11/2012 | Smith | H04L 67/12 700/276 |
| 2013/0048266 | A1* | 2/2013 | Bauchot | H05K 7/20836 165/299 |
| 2013/0070409 | A1 | 3/2013 | Hoss | |
| 2013/0128455 | A1* | 5/2013 | Koblenz | G05D 23/1917 361/692 |
| 2013/0226364 | A1 | 8/2013 | Artman | |
| 2014/0218858 | A1 | 8/2014 | Shelnutt | |
| 2014/0233176 | A1 | 8/2014 | Montero | |

(Continued)

*Primary Examiner* — Robert E Fennema
*Assistant Examiner* — Jigneshkumar C Patel
(74) *Attorney, Agent, or Firm* — Isidore PLLC

(57) ABSTRACT

A method for cooling components of an information handling system (IHS) includes detecting, via a thermal control system, at least one pressure reading, at least one temperature reading and at least one current cooling device setting of the IHS. At least one new cooling device setting is calculated based on the pressure reading and the temperature reading. The new cooling device setting is compared to the current cooling device setting associated with one or more cooling devices of the IHS. In response to the new cooling device setting being different from the current cooling device setting, one or more of the corresponding cooling devices are triggered to adjust its/their current cooling device setting to the new cooling device setting corresponding to the respective cooling device.

19 Claims, 6 Drawing Sheets

(56) References Cited

U.S. PATENT DOCUMENTS

2015/0060009 A1* 3/2015 Shelnutt .................... G01F 1/74
165/11.1
2015/0324135 A1* 11/2015 Chan ....................... G06F 3/061
711/114

* cited by examiner

SYSTEM AND METHOD FOR COOLING AN INFORMATION HANDLING SYSTEM

BACKGROUND

1. Technical Field

The present disclosure generally relates to information handling systems and in particular to cooling of an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Providing thermal management and cooling to an information handling system is important to prevent overheating and to maintain system reliability. Current information handling systems use temperature feedback from thermal sensors embedded on a chip or mounted on a motherboard to regulate cooling. Unfortunately, many components, such as hard disk drives and graphics cards, do not have thermal sensors and are located in areas within an information handling system that do not have thermal sensors to provide temperature feedback. This causes the thermal management system to err on the safe side by operating fan speeds at higher levels than would otherwise be required to cool the system. The higher fan speeds produce poor acoustic performance and cause increased power consumption by the information handling system.

Another problem with current information handling systems is that thermal sensors can give readings that indicate the system is operating within specifications when in fact hotspots may be occurring in different areas of the information handling systems due to inadequate or blocked air flow. For example, a plugged filter can cause a reduction in airflow to a corresponding section of the information handling system.

BRIEF SUMMARY

Disclosed are a method and a cooling control system for cooling components of an information handling system (IHS) and an IHS implementing the method and/or system for cooling components of the IHS.

According to one embodiment, the method comprises detecting, via a thermal control system, at least one pressure reading, at least one temperature reading and at least one current cooling device setting of the IHS. At least one new cooling device setting is calculated based on the pressure reading and the temperature reading. The new cooling device setting is compared to the current cooling device setting/s associated with one or more cooling devices of the IHS. In response to the new cooling device setting being different from the current cooling device setting/s, one or more of the corresponding cooling devices are triggered to adjust its current cooling device setting to the new cooling device setting corresponding to the respective cooling device.

According to another embodiment, a cooling control system for an IHS comprises a cooling controller. At least one cooling device is communicatively coupled to the cooling controller for cooling one or more components of the IHS. At least one temperature sensor is communicatively coupled to the cooling controller and senses at least one temperature reading associated with the IHS. At least one pressure sensor is communicatively coupled to the cooling controller and senses at least one pressure reading associated with the IHS. The cooling controller has firmware executing thereon to enable thermal control of the components of the IHS. The firmware configures the thermal control system to detect and/or retrieve the temperature reading and the pressure reading corresponding to an area of the IHS, and to detect and/or read at least one current cooling device setting of at least one cooling device of the IHS. The thermal control system calculates at least one new cooling device setting based on the pressure reading and the temperature reading and determines if the new cooling device setting is different from the current cooling device setting associated with the at least one cooling device of the IHS. In response to the new cooling device setting being different from the current cooling device setting, the thermal control system triggers the at least one cooling device to replace the current cooling device setting with the new cooling device setting associated with each respective cooling device.

Also disclosed is an information handling system (IHS) that comprises a processor and a memory that is coupled to the processor via a system interconnect. A cooling controller is communicatively coupled to at least one cooling device for cooling one or more components of the IHS. At least one temperature sensor is communicatively coupled to the cooling controller and senses at least one temperature reading associated with the IHS. At least one pressure sensor is communicatively coupled to the cooling controller and senses at least one pressure reading associated with the IHS. The cooling controller has firmware executing thereon to enable thermal control of the components of the IHS. The firmware configures the thermal control system to detect and/or retrieve the temperature reading and the pressure reading corresponding to an area of the IHS and to detect and/or read at least one current cooling device setting of at least one cooling device of the IHS. The cooling controller calculates at least one new cooling device setting based on the pressure reading and the temperature reading. The cooling controller determines if the new cooling device setting is different from the current cooling device setting associated with at least one cooling device of the IHS. In response to the new cooling device setting being different from the current cooling device setting, the cooling controller triggers the at least one cooling device to replace the current cooling device setting with the new cooling device setting associated with each respective cooling device.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

The illustrative embodiments provide a method and a cooling control system for cooling components of an information handling system (IHS) and an IHS implementing the method and/or system for cooling components of the IHS.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
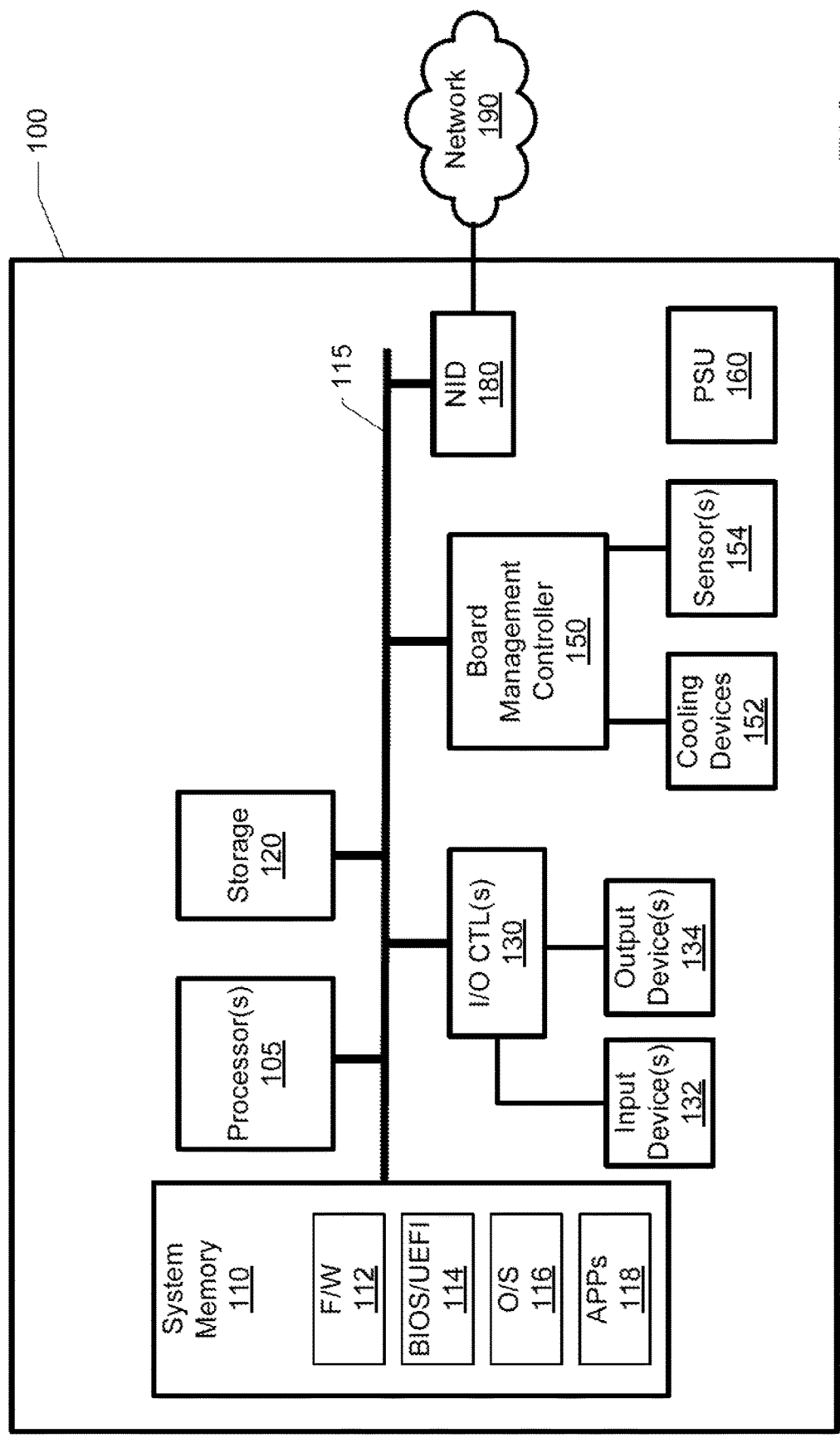
FIG. 1 illustrates an example information handling system within which various aspects of the disclosure can be implemented, according to one or more embodiments.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes processor(s) 105 coupled to system memory 110 via system interconnect 115. System interconnect 115 can be interchangeably referred to as a system bus, in one or more embodiments. Also coupled to system interconnect 115 is storage 120 within which can be stored one or more software and/or firmware modules and/or data (not specifically shown). In one embodiment, storage 120 can be hard drive or a solid state drive. The one or more software and/or firmware modules within storage 120 can be loaded into system memory 110 during operation of IHS 100. As shown, system memory 110 can include therein a plurality of software and/or firmware modules including firmware (F/W) 112, basic input/output system (BIOS) 114, operating system (O/S) 116, and application(s) 118.

In one or more embodiments, BIOS 114 comprises additional functionality associated with unified extensible firmware interface (UEFI), and can be more completely referred to as BIOS/UEFI in these embodiments. The various software and/or firmware modules have varying functionality when their corresponding program code is executed by processor(s) 105 or other processing devices within IHS 100.

IHS 100 further includes one or more input/output (I/O) controllers 130 which support connection by, and processing of signals from, one or more connected input device(s) 132, such as a keyboard, mouse, touch screen, or microphone. I/O controllers 130 also support connection to and forwarding of output signals to one or more connected output devices 134, such as a monitor or display device or audio speaker(s).

Additionally, in one or more embodiments, IHS 100 includes a board management controller (BMC) 150, cooling devices 152 and sensors 154. BMC 150 is in communication with processor(s) 105 and system memory 110 via system interconnect 115. BMC 150 contains components that control specific operations of IHS 100 such as power and thermal management. BMC 150 is in communication with cooling devices 152 and sensors 154. Cooling devices 152 can be one or more fans that are positioned to cool IHS 100 during operation of IHS 100. Sensors 154 can include various types of sensors such as temperature sensors, pressure sensors and flow sensors. Sensors 154 provide an electrical signal to BMC 150 that is indicative of or proportional to the quantity being read, measured or sensed by the sensor. IHS 100 further includes one or more power supply units (PSU) 160. PSU 160 provides a regulated source of power to IHS 100.

In one embodiment, several IHSs 100 can be mounted in a rack to form a rack level system or rack level server system. The rack level system includes several sensors 154 mounted within the rack to measure temperature and pressure readings within the rack. The rack level system further includes several cooling devices 152 mounted within the rack. Cooling devices 152 are controlled via board management controller (BMC) 150 to cool the overall rack level system including all of the IHSs within the rack level system based on the temperature and pressure readings.

IHS 100 further comprises a network interface device (NID) 180. NID 180 enables IHS 100 to communicate and/or interface with other devices, services, and components that are located external to IHS 100. These devices, services, and components can interface with IHS 100 via an external network, such as example network 190, using one or more communication protocols. Network 190 can be a local area network, wide area network, personal area network, and the like, and the connection to and/or between network and IHS 100 can be wired or wireless or a combination thereof. For purposes of discussion, network 190 is indicated as a single collective component for simplicity. However, it is appreciated that network 190 can comprise one or more direct connections to other devices as well as a more complex set of interconnections as can exist within a wide area network, such as the Internet.

Figure 2:
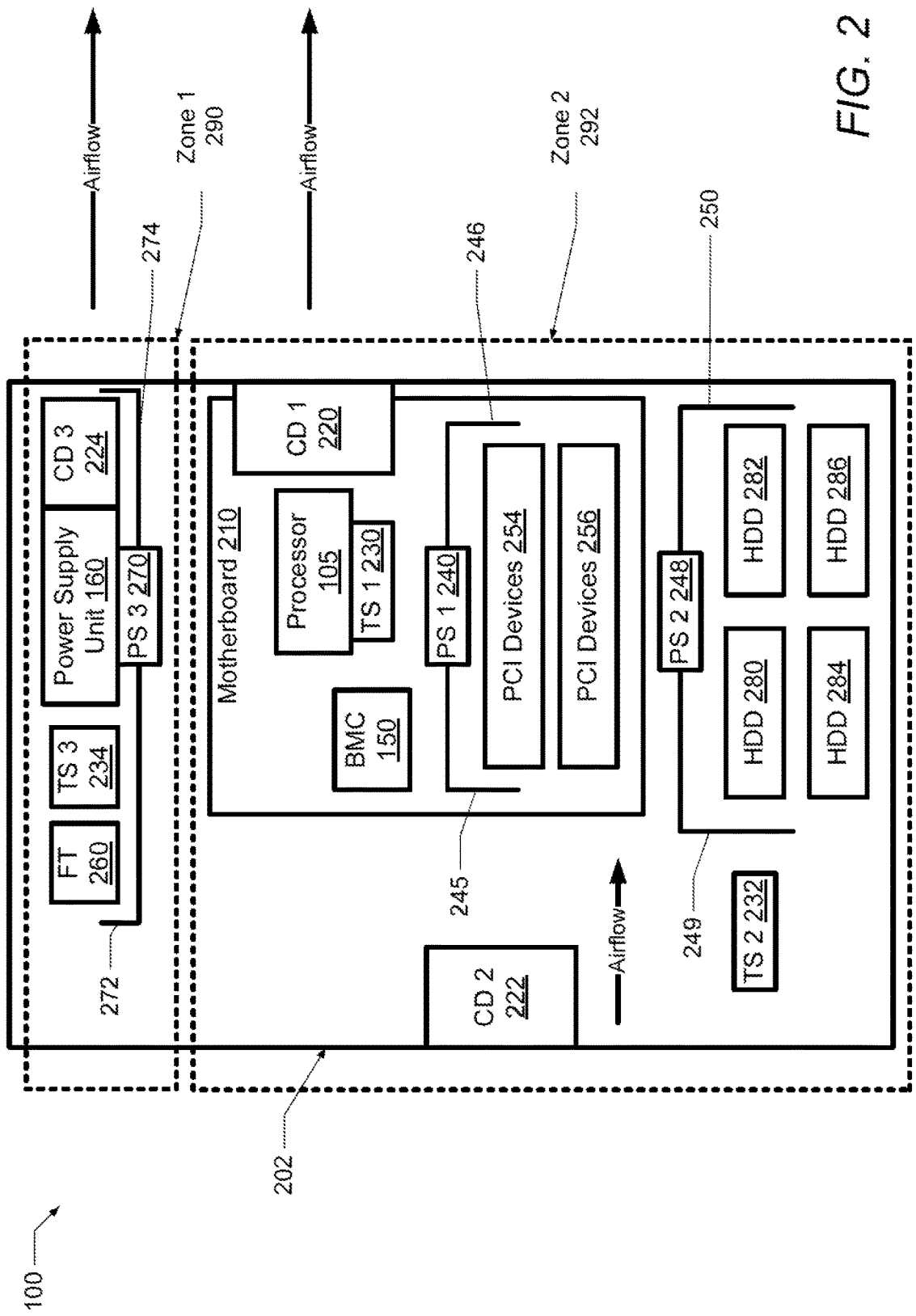
FIG. 2 is a block diagram illustrating a physical layout of components and control zones within the example information handling system, in accordance with one embodiment.

With reference now to FIG. 2, there is illustrated one embodiment of a physical layout of components and control zones within IHS 100.

IHS 100 can be divided into one or more cooling zones such as zone 1 290 and zone 2 292. While two cooling zones are shown in FIG. 2, IHS 100 can include only one cooling zone or can include a large number of (e.g., twenty or more) cooling zones. Each cooling zone can be independently controlled by components of BMC 150 during the operation of IHS 100. IHS 100 includes a chassis 202 that contains the components of IHS 100. In one embodiment chassis 202 can contain a single IHS. In another embodiment, chassis 202 can be representative of a server rack that holds several IHSs.

Cooling zone 2 292 includes a motherboard 210 and PCI devices 254 and 256. Motherboard 210 is mounted in chassis 202. Motherboard 210 is a printed circuit board that contains several primary components of IHS 100, including processor 105 and BMC 150, which are mounted to motherboard 210. IHS 100 can also include one or more peripheral component interface (PCI) devices 254 and 256 that are mounted to motherboard 210. When connected within IHS 100, the one or more PCI devices can be in communication with other components of IHS 100. In one embodiment, PCI devices 254 and 256 can include network printed circuit boards (PCBs), sound PCBs, video PCBs and other PCBs.

Cooling zone 2 292 further includes cooling devices (CD) 1 220 and CD 2 222, temperature sensors (TS) 1 230 and TS 2 232. CD 1 220 can be mounted to chassis 202. In one embodiment, CD 1 220 can be mounted in proximity to processor 105. CD 1 220 provides cooling to components of IHS 100. TS 1 230 is mounted to motherboard 210 adjacent to processor 105. TS 1 230 measures the temperature of processor 105 or an area adjacent to processor 105. TS 1 230 provides an electrical signal or reading corresponding to the temperature of processor 105. TS 1 230 can be one of various types of temperature sensors such as a thermistor, a thermocouple, a resistance thermometer or a silicon bandgap temperature sensor.

Cooling zone 2 292 also includes pressure sensor (PS) 1 240 and PS 2 248. PS 1 240 is mounted to motherboard 210 adjacent to PCI devices 254. In one embodiment, PS 1 240 is a differential pressure sensor having two tubes that record or measure absolute pressure at two different locations. A first tube 245 is connected to one side of PS 1 240 and a second tube 246 is connected to the other side of PS 1 240. The other end of the first tube 245 terminates in proximity to one end of PCI devices 254. The other end of the second tube 246 terminates in proximity to the other end of PCI devices 254 and 256. As a differential pressure sensor, PS 1 240 measures the difference between two pressures, one measured, detected, or recorded by the tubes on each side of the sensor. Differential pressure sensors measure the pressure difference or drops across an area or object or between a high pressure region and low pressure region. PS 1 240 measures the difference between pressures on each side of PCI devices 254 and 256 and provides an electrical signal or reading that is proportional to the pressure difference.

Cooling zone 2 292 also includes several hard disk drives (HDD) 280, 282, 284 and 286 that are mounted within chassis 202. HDD 280-286 are in communication with motherboard 210. PS 2 248 is mounted within chassis 202 adjacent to HDD 280-286. In one embodiment, PS 2 248 is a differential pressure sensor having two tubes that record or measure absolute pressure at two different locations. A first tube 249 is connected to one side of PS 2 248 and a second tube 250 is connected to the other side of PS 2 248. The other end of the first tube 249 terminates in proximity to one end of HDD 280-286. The other end of the second tube 250 terminates in proximity to the other end of HDD 280-286. PS 2 248 measures the difference in air pressure between the ends of HDD 280-286 and provides an electrical signal or reading that is proportional to the pressure difference.

CD 2 222 is mounted to one side of chassis 202. CD 2 222 provides cooling to PCI devices 254 and 256 and HDD 280-286. In one embodiment, CD 2 222 can be a fan that blows air through chassis 202. Another TS, TS 2 232 is mounted within chassis 202. TS 2 232 measures the temperature of air flowing over PCI devices 254 and 256 and HDD 280-286. TS 2 232 provides an electrical signal or reading corresponding to the temperature of the air within chassis 202. During operation, BMC 150 can control cooling within cooling zone 2 292 via CDs 220 and 222, TSs 230 and 232 and PSs 240 and 248.

IHS 100 has another cooling zone, cooling zone 1 290. Cooling zone 1 290 includes PSU 160, CD 3 224, TS 3 234, filter (FT) 260 and PS 3 270. PSU 160 is mounted in chassis 202. CD 3 224 is mounted adjacent to PSU 160. PSU 160 is also mounted in chassis 202. CD 3 224 can draw air through PSU 160 and exhaust the air from chassis 202 in order to cool PSU 160. A TS 3 234 is mounted adjacent to PSU 160. In one embodiment TS 3 234 is mounted within the housing of PSU 160. TS 3 234 measures the temperature of air flowing through PSU 160. TS 3 234 provides an electrical signal corresponding to the temperature of the air within PSU 160. A filter (FT) 260 is mounted over an air intake for CD 3 224. Filter 260 removes dust and debris from the air entering CD 3 224 that may otherwise clog CD 3 224.

PS 3 270 is mounted within chassis 202 in proximity to PSU 160. A first tube 272 is connected to one side of PS 3 270 and a second tube 274 is connected to the other side of PS 3 270. The other end of first tube 272 terminates at the inlet side of filter 260. The other end of second tube 274 terminates at the outlet side of CD 3 224. PS 3 270 measures the difference in air pressure between the inlet of filter 260 and the outlet of CD 3 224 and provides an electrical signal or reading that is proportional to the pressure difference. During operation, BMC 150 can control cooling within cooling zone 1 290 via CD 3 224, TS 3 234 and PS 3 270. In one embodiment, PS 3 270 can sense if filter 260 is plugged or clogged.

Figure 3:
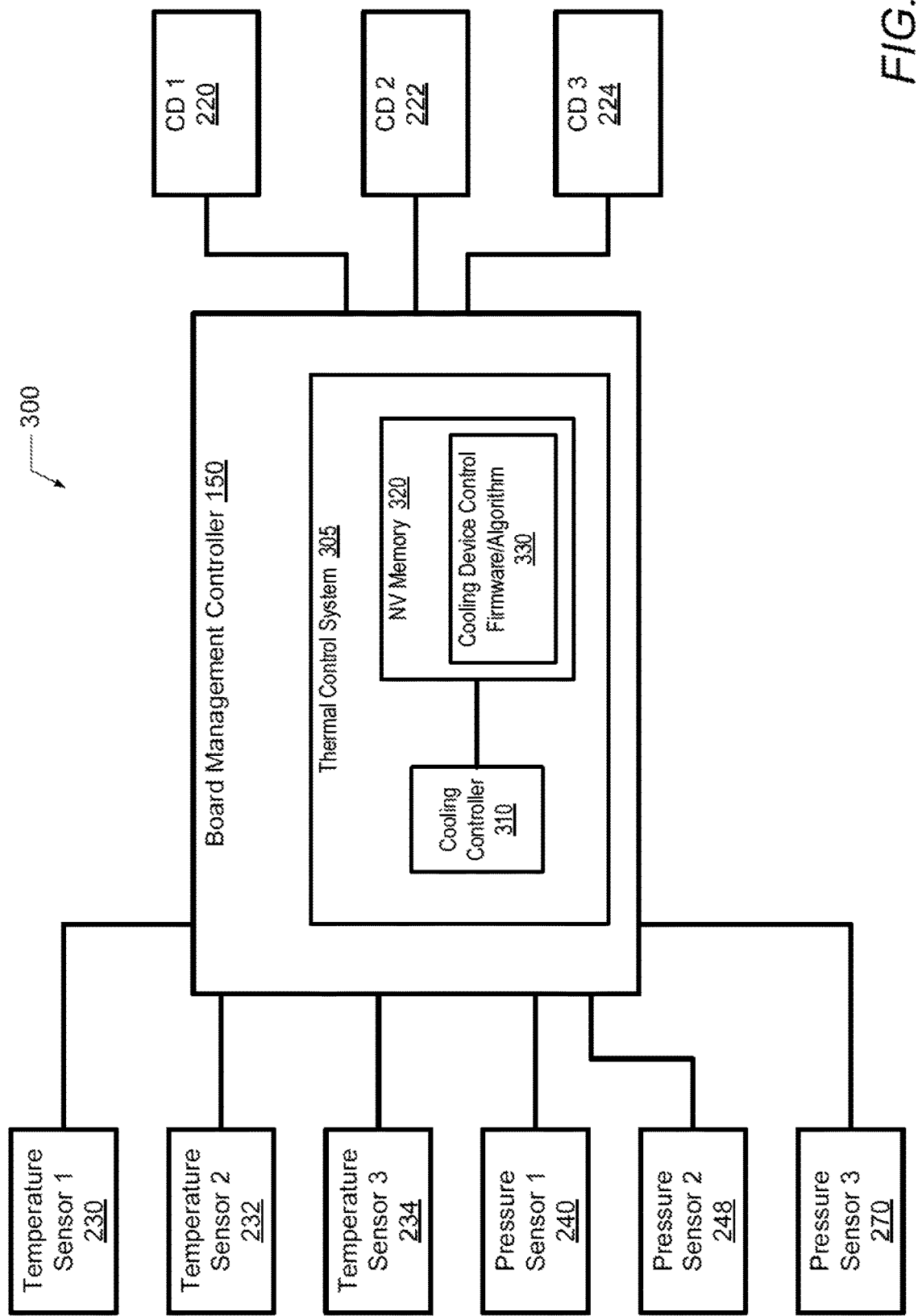
FIG. 3 is a block diagram of a cooling control system, in accordance with one embodiment.

FIG. 3 illustrates additional details of cooling control system 300. Cooling control system 300 comprises BMC 150, cooling devices (CDs) 220-224, temperature sensors (TSs) 230-234 and pressure sensors (PSs) 240, 248 and 270. BMC 150 includes a thermal control system 305 that provides thermal management of IHS 100 during normal operations. Thermal control system 305 includes a cooling controller 310 that is in communication with non-volatile (NV) memory 320. NV memory 320 stores cooling device control firmware/algorithm 330. Cooling device control firmware/algorithm 330, when executed by cooling controller 310, causes cooling device controller 310 to control the cooling of IHS 100 during operation by performing the various processes introduced by the methods of FIGS. 5 and 6, described hereafter.

Each of CDs 220-224 communicates with cooling controller 310 via BMC 150. Each of TSs 230-234 communicates with cooling controller 310 via BMC 150. Each of PSs 240, 248 and 270 are in communication with cooling controller 310 via BMC 150. BMC 150 contains one or more input/output controllers that support connection to and processing of signals from CDs 220-224, TSs 230-234 and PSs 240, 248 and 270. Cooling controller 310 can receive electrical signals from TSs 230-234 containing temperature measurements or readings from within IHS 100. Cooling controller 310 can receive electrical signals from PSs 240, 248 and 270 containing pressure measurements or readings from within IHS 100. Cooling controller 310 utilizes the temperature and pressure readings to control CDs 220-224.

Those of ordinary skill in the art will appreciate that the hardware components and basic configurations depicted in FIGS. 1-3 and described herein may vary. For example, the illustrative components within IHS 100 (FIG. 1), chassis 202 (FIG. 2) and cooling control system 300 (FIG. 3) are not intended to be exhaustive, but rather are representative to highlight components that can be utilized to implement aspects of the present disclosure. For example, other devices/components may be used in addition to or in place of the hardware depicted. The depicted example does not convey or imply any architectural or other limitations with respect to the presently described embodiments and/or the general disclosure.

Figure 4:
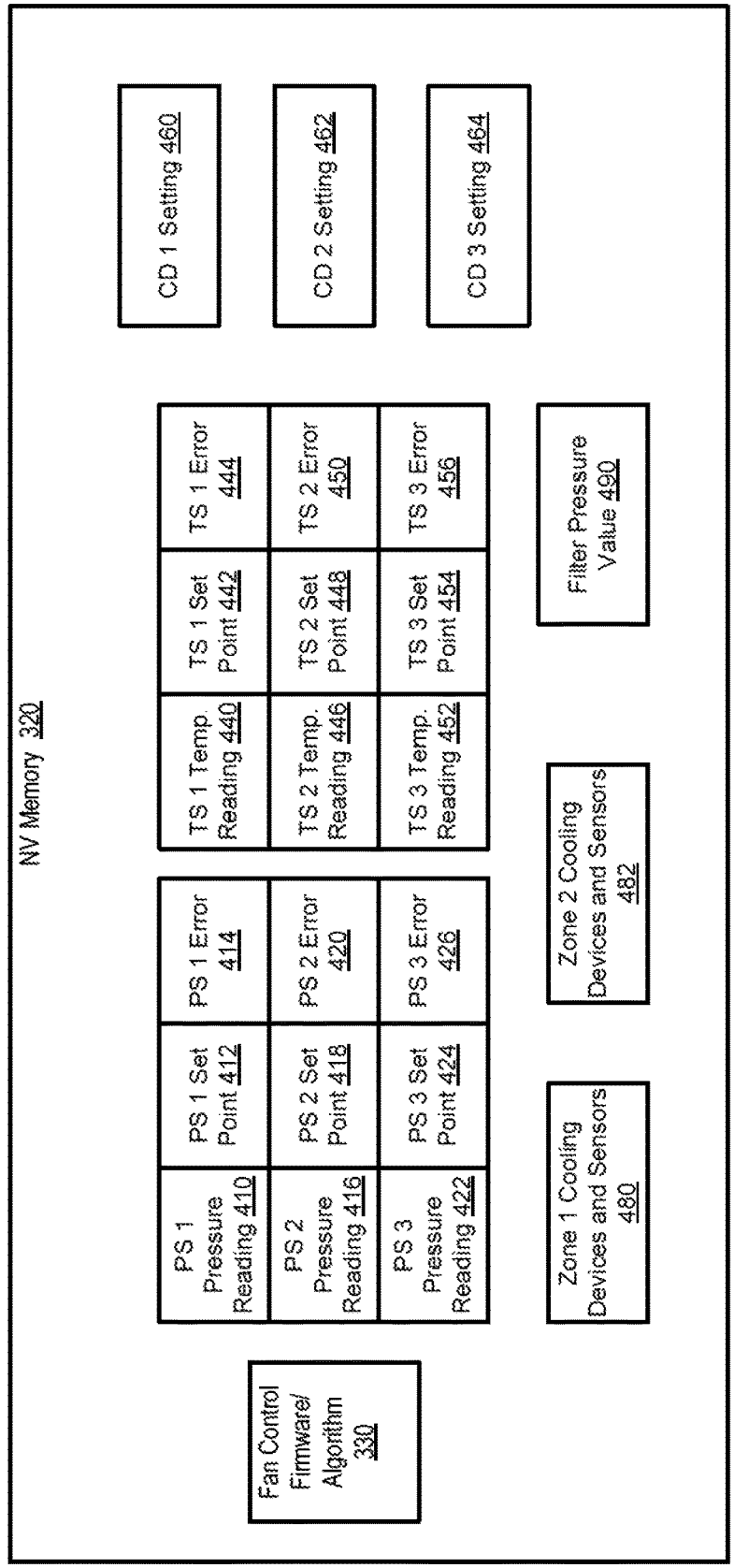
FIG. 4 is a block diagram illustrating contents of the memory of the thermal control system, in accordance with one embodiment.

With reference now to FIG. 4, one embodiment of example contents of non-volatile (NV) memory 320 is shown. In the description of FIG. 4, reference is also made to specific components illustrated within the preceding FIGS. 1-3. NV memory 320 stores cooling device control firmware/algorithm 330. Cooling device control firmware/algorithm 330 controls the cooling of IHS 100. NV Memory 320 further stores data representative of the settings, measurements and readings received from CDs 220-224, TSs 230-234 and PSs 240, 248 and 270 (FIG. 3).

As illustrated, NV memory 320 stores pressure sensor (PS) 1 pressure reading 410 received from PS 1 240, PS 2 pressure reading 416 received from PS 2 248, and PS 3 pressure reading 422 received from PS 3 270. NV memory 320 also stores a pre-determined PS 1 set point 412, a pre-determined PS 2 set point 418 and a pre-determined PS 3 set point 424. NV memory 320 further stores a PS 1 error 414, PS 2 error 420 and PS 3 error 426. PS errors 414, 420 and 426 are calculated by cooling controller 310 as the difference of the measured PS readings 410, 416 and 422 and their respective set points 412, 418 and 424 and are then stored to NV memory 320.

As also illustrated, NV memory 320 stores temperature sensor (TS) 1 temperature reading 440 received from TS 1 230, TS 2 temperature reading 446 received from TS 2 232, and TS 3 temperature reading 452 received from TS 3 234. NV memory 320 also stores a pre-determined TS 1 set point 442, a pre-determined TS 2 set point 448 and a pre-determined TS 3 set point 454. NV memory 320 further stores a TS 1 error 444, TS 2 error 450 and TS 3 error 456. TS errors 444, 450 and 456 are calculated by cooling controller 310 as the difference of the measured TS readings 440, 446 and 452 and their respective set points 442, 448 and 454 and are then stored to NV memory 320.

As further illustrated, NV memory 320 further stores current cooling device (CD) 1 setting 460 received from CD 1 220, CD 2 setting 462 received from CD 2 222, and CD 3 setting 464 received from CD 3 224. In one embodiment, CD settings 460-464 can be fan speeds of each respective cooling device. NV memory 320 further stores zone information for IHS 100. NV memory 320 stores zone 1 cooling devices and sensor information 480 and zone 2 cooling devices and sensor information 482. Zone information 480 and 482 contains data and information about each zone, such as the number and type of cooling devices, the number and type of temperature sensors and the number and type of pressure sensors. Zone information 480 and 482 can also contain data and information for each zone such as maximum zone temperatures and cooling device capacities. NV memory 320 also stores at least one filter pressure value 490. Filter pressure value 490 is a pre-determined pressure that indicates that filter 260 (FIG. 2) is clogged or plugged and requires changing or cleaning.

Figure 5:
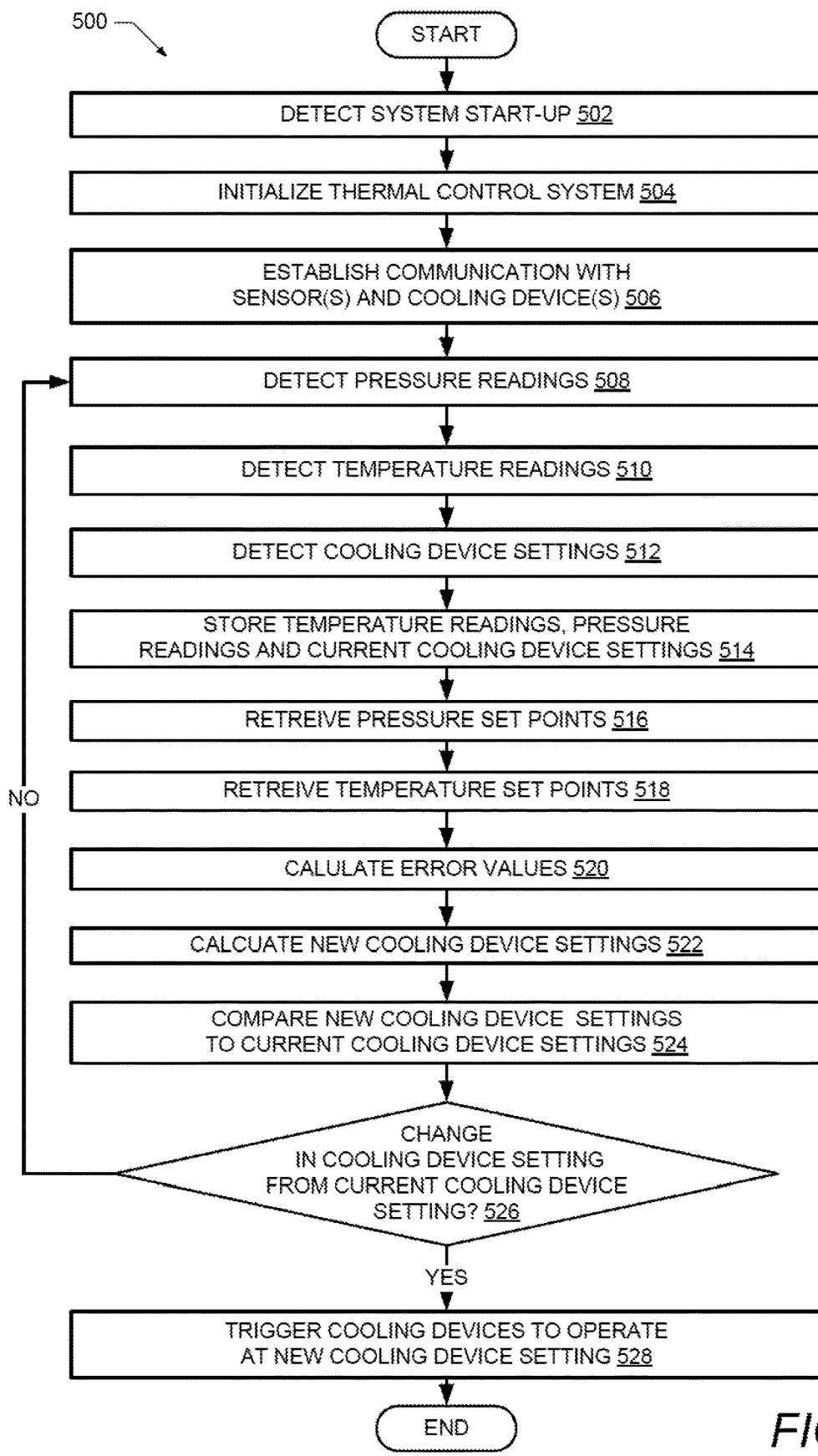
FIG. 5 is a flow chart illustrating one example of a method for cooling an information handling system, according to one or more embodiments.
Figure 6:
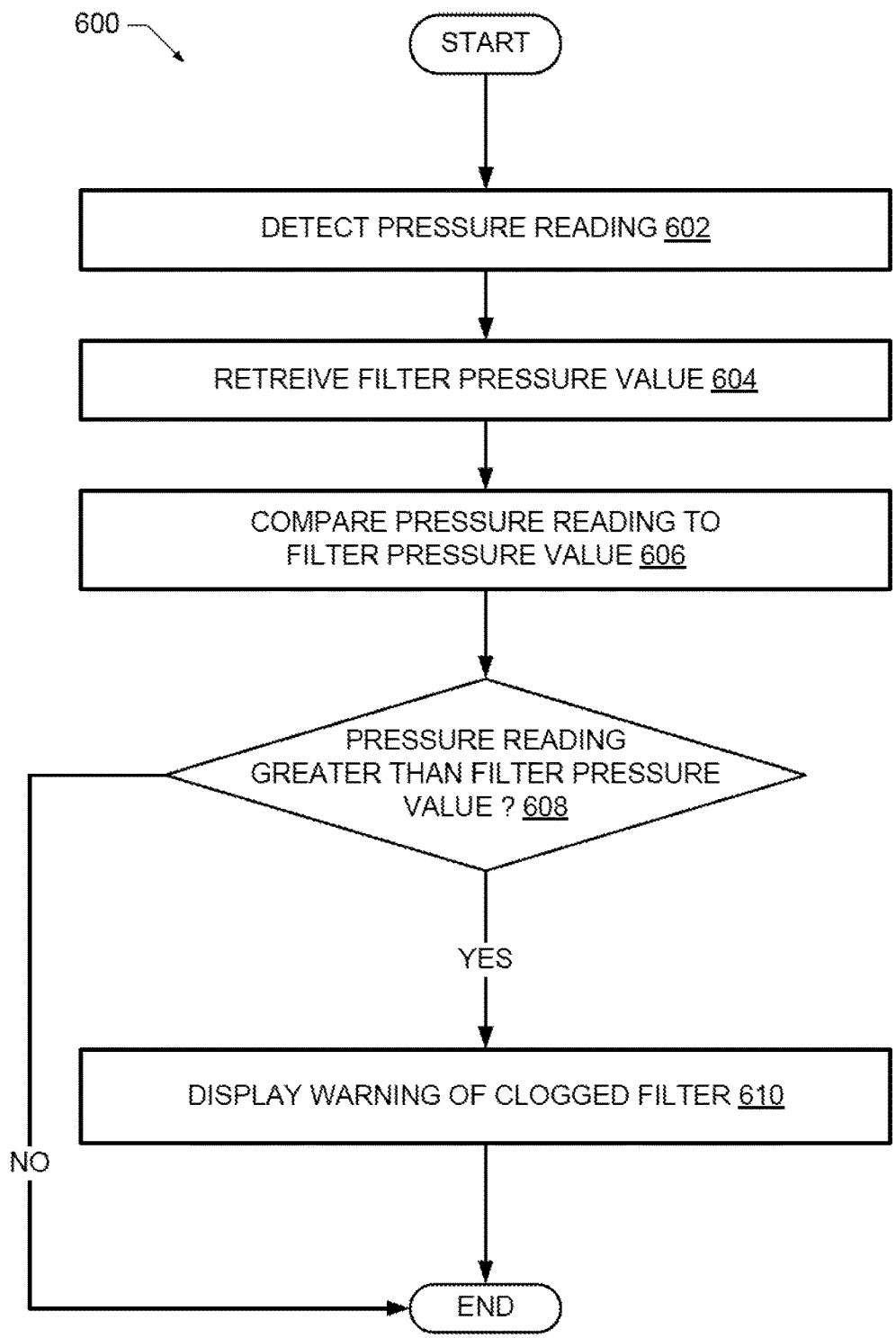
FIG. 6 is a flow chart illustrating one example of a method for detecting a clogged filter, associated with a cooling device within the example information handling system, in according to one or more embodiments.

FIGS. 5 and 6 illustrate flowcharts of exemplary methods by which cooling control system 300 and cooling controller 310 within the preceding figures performs different aspects of the processes that enable the one or more embodiments of the disclosure. Generally, method 500 represents a computer-implemented method to control cooling of an information handling system and method 600 represents a computer-implemented method to sense or detect a clogged filter associated with a cooling device of the IHS. The description of each method is provided with general reference to the specific components illustrated within the preceding FIGS. 1-4. Generally, each method is described as being implemented via cooling control system 300 and particularly the execution of code provided by cooling device firmware/algorithm 320 acting within cooling controller 310 to control cooling of IHS 100. It is however appreciated that certain aspects of the described methods may be implemented via other processing devices and/or execution of other code.

Method 500 begins at the start block and proceeds to block 502 where BMC 150 and thermal control system 305 detect that IHS 100 has been powered on. At block 504, the thermal control system 305 self-initializes. Initialization of thermal control system 305 includes cooling controller 310 loading cooling device firmware/algorithm 320 and retrieving cooling zone information 280 and 282. Thermal control system 305 establishes communications with CDs 220-224, TSs 230-234 and PSs 240, 248 and 270 (block 506). At block 508, cooling controller 310 detects PS 1 pressure reading 410 received from PS 1 240, PS 2 pressure reading 416 received from PS 2 248, and PS 3 pressure reading 422 received from PS 3 270. Cooling controller 310 further detects, at block 510, TS 1 temperature reading 440 received from TS 1 230, TS 2 temperature reading 446 received from TS 2 232, and TS 3 temperature reading 452 received from TS 3 234. Additionally at block 512, cooling controller 310 detects and/or retrieves current CD 1 setting 460 received from CD 1 220, current CD 2 setting 462 received from CD 2 222, and current CD 3 setting 464 received from CD 3 224.

Cooling controller 310 stores the PS readings 410, 416 and 422, TS readings 440, 446 and 452 and cooling device settings 460, 462 and 464 to NV memory 320 (block 514). Cooling controller 310 retrieves PS 1 set point 412, PS 2 set point 418 and PS 3 set point 424 (block 516). Further at block 518, cooling controller 310 retrieves temperature set points TS 1 set point 442, TS 2 set point 448 and TS 3 set point 454. Cooling controller 310 calculates error values for both temperature and pressure readings (block 520). Specifically, cooling controller 310 calculates TS errors 444, 450 and 456 as the difference of the measured TS reading 440, 446 and 452 and their respective set points 442, 448 and 454. PS errors 414, 420 and 426 are calculated by cooling controller 310 as the difference of the measured PS readings 410, 416 and 422 and their respective set points 412, 418 and 424.

At block 522, cooling controller 310 calculates new cooling device settings for each of the cooling devices based on the pressure sensor readings and the temperature sensor readings for each corresponding cooling zone. The calculation of new cooling device settings is performed using a fan control algorithm. A wide variety of fan control algorithms can be used. Some examples of the types of fan control algorithms that can be used are linear algorithms, piecewise linear algorithms and proportional integral derivative (PID) algorithms. The fan control algorithm uses the pressure sensor readings and temperature sensor readings as variable inputs.

Cooling controller 310 calculates new cooling device settings for the cooling devices (CD 1 220 and CD 222) in cooling zone 2 292 based on the pressure sensor readings from PS 1 240 and PS 2 248 and the temperature sensor readings from TS 1 230 and TS 2 232. Cooling controller 310 calculates new cooling device settings for the cooling devices (CD 3 224) in cooling zone 1 290 based on the pressure sensor readings from PS 3 270 and the temperature sensor readings from TS 3 234.

In one embodiment, cooling controller 310 calculates the new cooling device settings for CDs 220-224 using the calculated TS error values 444, 450 and 456 and PS errors values 414, 420 and 426. If both of the PS and TS error values are zero, then the new cooling device settings are the same as the current cooling device settings (i.e., no change in cooling device settings). The new calculated cooling device settings for CDs 220-224 are compared to the current cooling device settings 460-464 (block 524). Cooling controller 310 determines if the new cooling device settings are different from the current cooling device settings 460-464 (decision block 526).

In response to the new cooling device settings not being different from the current cooling device settings, cooling controller 310 continues to detect PS pressure readings 410, 416 and 422, TS temperature readings 440, 446 and 452 and current CD cooling settings 460-464 (blocks 508, 510 and 512). In response to at least one of the new cooling device settings being different from the current cooling device settings, cooling controller 310 triggers the corresponding CDs 220-224 in each corresponding cooling zone to adjust or replace their current cooling settings to the new calculated cooling setting for each respective cooling device that is affected (block 528). Each of the CDs 220-224 is triggered to adjust or change its cooling setting according to the new calculated cooling setting. Method 500 then ends.

Turning now to FIG. 6, a flow chart illustrating an example method 600 for detecting a clogged filter, e.g., filter 260, is shown. Method 600 begins at the start block and proceeds to block 602 where cooling controller 310 detects pressure sensor readings from sensors located in airflow paths having a filter. As an example, PS 3 270 is in the airflow path of filter 260. Cooling controller 310 detects PS 3 pressure readings 422 received from PS 3 270. Cooling controller 310 retrieves at least one filter pressure value 490 from NV memory 320 (block 604). Cooling controller 310 compares PS 3 pressure reading 422 to the filter pressure value 490 (block 606).

Cooling controller 310 determines if PS 3 reading 422 is greater than filter pressure value 490 (decision block 608). When the PS 3 reading 422 is less than filter pressure value 490, indicating that filter 260 not clogged, method 600 terminates. In response to PS 3 reading 422 being greater than clogged filter pressure sensor level 490, indicating that filter 260 is clogged, cooling controller 310 displays a warning or notification of a clogged or plugged filter 260 on output device(s) 134 (block 610). Method 600 then ends.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A computer implemented method for cooling an information handling system (IHS), the method comprising:
 detecting, via a thermal control system, at least one pressure reading, at least one temperature reading, and at least one current cooling device setting for at least one active cooling device in each of at least two cooling zones of the IHS, the at least one pressure reading including an internal pressure reading within the IHS;
 retrieving, from a non-volatile (NV) memory, at least one pressure set point corresponding to a first cooling zone in which a pressure sensor provides a pressure reading of the at least one pressure reading;
 calculating at least one pressure error value based on the pressure reading and the corresponding pressure set point;
 retrieving, from the non-volatile (NV) memory, at least one temperature set point corresponding to the first cooling zone in which a temperature sensor provides a temperature reading of the at least one temperature reading;

calculating at least one temperature error value based on the temperature reading and the corresponding temperature set point;

calculating, using a fan control algorithm, at least one new cooling device setting based on both the at least one pressure reading within the IHS and the at least one temperature reading, wherein said calculating the new cooling device setting is performed based on the calculated at least one pressure error value and the calculated at least one temperature error value, the at least one cooling device comprising one or more fans that are positioned to cool one or more components of the IHS during operation of the IHS and which are communicatively coupled to and controlled by a cooling controller to cool the IHS, the new cooling device setting comprising fan speeds of each of the one or more fans;

determining if the at least one new cooling device setting associated with one or more cooling devices of the IHS is different from a current cooling device setting of the one or more cooling devices, the current cooling device setting received from the cooling device and stored in the NV memory and comprising current fan speeds of each respective cooling device; and in response to at least one of the new cooling device setting being different from the current cooling device setting for a corresponding cooling device, triggering one or more corresponding cooling devices in the first cooling zone within the IHS to adjust its current cooling device setting to the new cooling device setting corresponding to the respective cooling device that is affected within the corresponding first cooling zone.

2. The method of claim 1, further comprising:

initializing the thermal control system during start-up of the IHS;

establishing communication between the thermal control system, a cooling device controller, the at least one pressure sensor, the at least one temperature sensor, and the one or more cooling devices;

loading cooling device algorithm and retrieving cooling zone information from non-volatile (NV) memory; and enabling operation of the cooling device controller, the at least one pressure sensor, the at least one temperature sensor and the cooling devices using the cooling device algorithm and cooling zone information retrieved from the NV memory.

3. The method of claim 2, wherein retrieving cooling zone information from NV memory comprises:

retrieving zone information comprising, for each zone, cooling devices and sensor information, data and information about each zone, including a number and type of cooling devices, a number and type of temperature sensors and a number and type of pressure sensors.

4. The method of claim 3, wherein the zone information further comprises data and information for each zone, including maximum zone temperatures and cooling device capacities.

5. The method of claim 1, further comprising:

retrieving first zone information for the IHS, wherein the first zone information includes at least one pressure sensor, at least one temperature sensor, and at least one cooling device of the one or more cooling devices within the first zone;

retrieving second zone information for the IHS, wherein the second zone information includes at least one pressure sensor, at least one temperature sensor, and at least one cooling device of the one or more cooling devices within the second zone;

calculating at least one new cooling device setting for each of the cooling devices in the first zone based on both the pressure sensor readings and the temperature sensor readings within the first zone; and calculating at least one new cooling device setting for each of the cooling devices in the second zone based on both the pressure sensor readings and the temperature sensor readings within the second zone.

6. The method of claim 1, wherein the pressure reading is detected by a differential pressure sensor.

7. The method of claim 1, further comprising:

retrieving a filter pressure value associated with an air filter of the IHS;

comparing a pressure reading from a location of the air filter to the filter pressure value; and in response to the pressure reading being greater than the filter pressure value, outputting a warning message indicating that the air filter is clogged, and including, within the warning message, information about the location of the air filter within the IHS.

8. The method of claim 1, wherein the IHS is configured with at least two cooling zones, each having at least one active cooling device, at least one temperature sensor, at least one pressure sensor, and each cooling zone independently controlled by a controller of the thermal control system during the operation of the IHS, the controller controlling cooling within each respective cooling zone via the at least one active cooling device, based on a reading received from the temperature sensor and pressure sensor located with a corresponding cooling zone.

9. A cooling control system of an information handling system (IHS), the cooling control system comprising:

a cooling controller;

at least two cooling zones within the IHS, each cooling zone independently controlled by the cooling controller during operation of the IHS, each cooling zone comprising:

at least one cooling device communicatively coupled to the cooling controller for cooling one or more components of the IHS within a corresponding one of the at least two cooling zones, the at least one cooling device comprising one or more fans that are positioned to cool the IHS during operation of the IHS and which are communicatively coupled to and controlled by the cooling controller to cool the IHS;

at least one temperature sensor communicatively coupled to the cooling controller and which senses at least one temperature reading associated with the corresponding zone of the IHS; and at least one pressure sensor communicatively coupled to the cooling controller and which senses at least one pressure reading associated with the corresponding zone of the IHS, the at least one pressure reading including an internal pressure reading within the IHS;

the cooling controller having firmware executing thereon to enable thermal control of the components within the cooling zones of the IHS, wherein the firmware configures the cooling control system to:

detect and/or retrieve the temperature reading and the pressure reading corresponding to each of the at least two cooling zones of the IHS, and detect and/or read at least one current cooling device setting of at least one cooling device within each of the at least two cooling zones of the IHS;

retrieve, from a non-volatile (NV) memory, at least one pressure set point corresponding to the cooling zone in which a pressure sensor provides a corresponding pressure reading of the at least one pressure reading;

calculate at least one pressure error value based on the pressure reading and the corresponding pressure set point;

retrieve, from the non-volatile (NV) memory, at least one temperature set point corresponding to the cooling zone in which the temperature sensor provides a corresponding temperature reading of the at least one temperature reading;

calculate at least one temperature error value based on the temperature reading and the corresponding temperature set point;

calculate at least one new cooling device setting based on both the pressure reading and the temperature reading within the IHS, wherein the cooling controller calculate the at least one new cooling device setting based on the calculated at least one pressure error value and the calculated at least one temperature error value, the at least one cooling device comprising one or more fans that are positioned to cool one or more components of the IHS during operation of the HIS, and the new cooling device setting comprising fan speeds of each of the one or more fans;

determine if the at least one new cooling device setting is different from a current cooling device setting associated with the at least one cooling device of the IHS, the current cooling device setting received from the cooling device and stored in the NV memory and comprising current fan speeds of each respective cooling device; and in response to the at least one new cooling device setting being different from the current cooling device setting for at least one corresponding cooling device, trigger at least the corresponding cooling device to replace the current cooling device setting with the new cooling device setting associated with each respective corresponding cooling device that is affected within the corresponding cooling zone.

10. The cooling control system of claim 9, wherein the firmware further configures the cooling controller to:
initialize the thermal control system during start-up of the IHS;
establish communication between the thermal control system, a cooling device controller, the at least one pressure sensor, the at least one temperature sensor and the one or more cooling devices;
load cooling device algorithm and retrieving cooling zone information from non-volatile (NV) memory; and
enable operation of the cooling device controller, the at least one pressure sensor, the at least one temperature sensor and the cooling devices using the cooling device algorithm and cooling zone information retrieved from the NV memory.

11. The cooling control system of claim 9, wherein the firmware further configures the cooling controller to:
retrieve first zone information for the IHS, wherein the first zone information includes at least one of the pressure sensors, at least one of the temperature sensors, and at least one of the cooling devices within the first zone;
retrieve second zone information for the IHS, wherein the second zone information includes at least one pressure sensor, at least one temperature sensor, and at least one cooling device of the one or more cooling devices within the second zone;
calculate at least one new cooling device setting for each of the cooling devices in the first zone based on both the pressure sensor reading and the temperature sensor reading within the first zone; and
calculate at least one new cooling device setting for each of the cooling devices in the second zone based on both the pressure sensor readings and the temperature sensor readings within the second zone.

12. The cooling control system of claim 9, wherein the pressure sensor is a differential pressure sensor.

13. The cooling control system of claim 9, wherein the firmware further configures the cooling controller to:
retrieve a filter pressure value associated with an air filter of the IHS;
compare a pressure reading from a location of the air filter to the filter pressure value; and
in response to the pressure reading being greater than the filter pressure value, output a warning message indicating that the air filter is clogged, and include, within the warning message, information about the location of the air filter within the IHS.

14. An information handling system (IHS) comprising:
a processor and a memory coupled to the processor via a system interconnect;
a cooling controller;
at least one cooling device located within each cooling zone of at least two cooling zones within the IHS, each of the at least one cooling device communicatively coupled to the cooling controller for cooling one or more components of the IHS, the cooling controller and at least one cooling device being a part of a thermal control system, the at least one cooling device comprising one or more fans that are positioned to cool the one or more components within one of the at least two cooling zones of the IHS during operation of the IHS and which are communicatively coupled to and controlled by the cooling controller to cool the IHS;
at least one temperature sensor communicatively coupled to the cooling controller and which senses at least one temperature reading associated with a corresponding one of the at least two cooling zones with the IHS;
at least one pressure sensor communicatively coupled to the cooling controller and which senses at least one pressure reading associated with a corresponding one of the at least two cooling zones with the IHS;
the cooling controller having firmware executing thereon to enable thermal control of the components of the IHS, wherein the firmware configures the thermal control system to:
detect and/or retrieve the temperature reading and the pressure reading corresponding to each of the at least two cooling zones within the IHS and detect and/or read at least one current cooling device setting of each of the at least one cooling device within each of the at least two cooling zones of the IHS;
retrieve, from a non-volatile (NV) memory, at least one pressure set point corresponding to a first cooling zone among the at least two cooling zones in which a pressure sensor provides a corresponding pressure reading of the at least one pressure reading;
calculate at least one pressure error value based on the pressure reading and the corresponding pressure set point;

retrieve, from the non-volatile (NV) memory, at least one temperature set point corresponding to the first cooling zone in which a temperature sensor provides a corresponding temperature reading of the at least one temperature reading;

calculate at least one temperature error value based on the temperature reading and the corresponding temperature set point;

calculate at least one new cooling device setting based on both the pressure reading and the temperature reading from within the IHS, wherein the thermal control system calculates the new cooling device setting, in part based on the calculated at least one pressure error value and the calculated at least one temperature error value, the at least one cooling device comprising one or more fans that are positioned to cool one or more components of the IHS during operation of the IHS, and the new cooling device setting comprising fan speeds of each of the one or more fans;

determine if the new cooling device setting is different from a current cooling device setting associated with at least one corresponding cooling device of the IHS, the current cooling device setting stored in the NV memory and comprising current fan speeds of each respective cooling device; and in response to the new cooling device setting being different from the current cooling device setting, trigger the at least one corresponding cooling device to replace the current cooling device setting with the new cooling device setting associated with each respective corresponding cooling device that is affected within the corresponding first cooling zone.

15. The information handling system of claim 14, wherein the firmware further configures the cooling controller to:
   initialize the thermal control system during start-up of the IHS;
   establish communication between the thermal control system, a cooling device controller, the at least one pressure sensor, the at least one temperature sensor, and the one or more cooling devices;
   load cooling device algorithm and retrieving cooling zone information from non-volatile (NV) memory; and
   enable operation of the cooling device controller, the at least one pressure sensor, the at least one temperature sensor, and the cooling devices using the cooling device algorithm and cooling zone information retrieved from the NV memory.

16. The information handling system of claim 14, wherein the firmware further configures the cooling controller to:
   retrieve first zone information for the IHS, wherein the first zone information includes at least one of the pressure sensors, at least one of the temperature sensors, and at least one of the cooling devices within the first zone;
   retrieve second zone information for the IHS, wherein the second zone information includes at least one pressure sensor, at least one temperature sensor, and at least one cooling device of the one or more cooling devices within the second zone;
   calculate at least one new cooling device setting for each of the cooling devices in the first zone based on both the pressure sensor reading and the temperature sensor reading within the first zone; and
   calculate at least one new cooling device setting for each of the cooling devices in the second zone based on both the pressure sensor readings and the temperature sensor readings within the second zone.

17. The information handling system of claim 14, wherein the pressure sensor is a differential pressure sensor.

18. The information handling system of claim 14, wherein the firmware further configures the cooling controller to:
   retrieve a filter pressure value associated with an air filter of the IHS;
   compare a pressure reading from a location of the air filter to the filter pressure value; and
   in response to the pressure reading being greater than the filter pressure value, output a warning message indicating that the air filter is clogged, and include, within the warning message, information about the location of the air filter within the IHS.

19. The information handling system of claim 14, wherein the cooling controller is a board management controller (BMC).

* * * * *